United States Patent
Allen et al.

(10) Patent No.: US 11,024,756 B2
(45) Date of Patent: Jun. 1, 2021

(54) APPARATUS FOR SENSING ELECTROMAGNETIC RADIATION INCIDENT SUBSTANTIALLY PERPENDICULAR TO THE SURFACE OF A SUBSTRATE

(71) Applicant: Nokia Technologies Oy, Espoo (FI)

(72) Inventors: Mark Allen, Great Cambourne (GB); Nadine Harris, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/309,404

(22) PCT Filed: Jun. 14, 2017

(86) PCT No.: PCT/FI2017/050441
§ 371 (c)(1),
(2) Date: Dec. 12, 2018

(87) PCT Pub. No.: WO2017/220857
PCT Pub. Date: Dec. 28, 2017

(65) Prior Publication Data
US 2019/0334038 A1   Oct. 31, 2019

(30) Foreign Application Priority Data
Jun. 21, 2016 (EP) ..................... 16175572

(51) Int. Cl.
*H01L 31/054* (2014.01)
*H01L 31/0232* (2014.01)
(Continued)

(52) U.S. Cl.
CPC ...... *H01L 31/02327* (2013.01); *G01J 1/0266* (2013.01); *G01J 1/0411* (2013.01);
(Continued)

(58) Field of Classification Search
CPC ................ H01L 31/00–208; H01L 33/00–648
See application file for complete search history.

(56) References Cited

U.S. PATENT DOCUMENTS 4,388,528 A   7/1983 Walter
4,467,193 A * 8/1984 Carroll ..................... G01V 8/20
250/216
(Continued)

FOREIGN PATENT DOCUMENTS

EP   2120374 A1   11/2009
EP   3070741 A1    9/2016
(Continued)

OTHER PUBLICATIONS

Konstantatos et al., "Hybrid Graphene-Quantum Dot Phototransistors With Ultrahigh Gain", Nature Nanotechnology, vol. 7, May 6, 2012, pp. 363-368.
(Continued)

*Primary Examiner* — Suberr L Chi
(74) *Attorney, Agent, or Firm* — Harrington & Smith

(57) ABSTRACT

An apparatus comprises a transparent substrate (3), at least one sensor (5) for the detection of electromagnetic radiation (31), and for each sensor a corresponding mirror having a reflective surface (11). The reflective surface (11) is shaped so that electro-magnetic radiation (31) incident on the transparent substrate (3) at a specific angle, passing through the transparent substrate (3) and being reflected by the reflective surface (11) is directed towards the sensor (5). The sensor (5) comprises a two dimensional material like graphene and may be a quantum dot functionalised graphene field effect transistor. The present invention enables the incident electromagnetic radiation (31) to be focussed onto the at least one sensor (5) without the use of additional optical compo-
(Continued)

nents like lenses or microlenses. This may enable focussed images to be obtained by the apparatus.

16 Claims, 10 Drawing Sheets

(51) Int. Cl.
| | | |
|---|---|---|
| *G01J 1/02* | (2006.01) | |
| *G01J 1/04* | (2006.01) | |
| *G01T 1/24* | (2006.01) | |
| *H01L 27/146* | (2006.01) | |
| *H01L 31/0224* | (2006.01) | |
| *H01L 31/112* | (2006.01) | |
| *G01J 1/44* | (2006.01) | |

(52) U.S. Cl.
CPC ........... *G01J 1/0414* (2013.01); *G01J 1/0448* (2013.01); *G01T 1/244* (2013.01); *H01L 27/14607* (2013.01); *H01L 27/14625* (2013.01); *H01L 27/14643* (2013.01); *H01L 31/0224* (2013.01); *H01L 31/112* (2013.01); *G01J 2001/4473* (2013.01)

(56) References Cited

U.S. PATENT DOCUMENTS

| | | | |
|---|---|---|---|
| 4,770,536 | A | 9/1988 | Golberstein |
| 7,619,807 | B2 | 11/2009 | Baek et al. |
| 9,196,766 | B1 | 11/2015 | Egerton et al. |
| 2011/0147741 | A1* | 6/2011 | Jung ................ H01L 27/1461 257/53 |
| 2011/0174370 | A1 | 7/2011 | Tsai |
| 2012/0000516 | A1 | 1/2012 | Bol et al. |
| 2012/0211858 | A1 | 8/2012 | Tsuchiya |
| 2013/0032782 | A1 | 2/2013 | Gerasimos et al. |
| 2013/0049738 | A1* | 2/2013 | Sargent ........... H01L 31/035218 324/96 |
| 2013/0104962 | A1 | 5/2013 | Weibezahn |
| 2013/0180570 | A1* | 7/2013 | Reynolds ................ H02S 30/10 136/248 |
| 2013/0201343 | A1 | 8/2013 | Jiang et al. |
| 2014/0020678 | A1 | 1/2014 | Krothapalli et al. |
| 2014/0137923 | A1* | 5/2014 | Gilman ................ H01L 31/043 136/246 |
| 2014/0261631 | A1 | 9/2014 | Morgan et al. |
| 2014/0332692 | A1* | 11/2014 | Lutz ....................... H01L 31/115 250/371 |
| 2017/0353145 | A1* | 12/2017 | Yang ....................... F24S 30/45 |

FOREIGN PATENT DOCUMENTS

| | | |
|---|---|---|
| EP | 3226309 A1 | 10/2017 |
| GB | 1323807 A | 7/1973 |
| JP | 2012173191 A | 9/2012 |
| KR | 20080008550 A | 1/2008 |
| KR | 20140046006 A | 4/2014 |
| WO | 98/57199 A1 | 12/1998 |
| WO | 2007/092545 A2 | 8/2007 |
| WO | 2011/160017 A2 | 12/2011 |
| WO | 2013/163468 A1 | 10/2013 |

OTHER PUBLICATIONS

"Advanced Light Control", Texas Instruments, Retrieved on Dec. 10, 2018, Webpage available at: http://www.ti.com/dlp-chip/advanced-light-control/overview.html.

Dijk et al., "3D-Printed Concentrator Arrays for External Light Trapping on Thin Film Solar Cells", Solar Energy Materials & Solar Cells, vol. 139, Aug. 2015, pp. 19-26.

"American Semiconductor Flex-SOC", American Semiconductor, Retrieved on Dec. 6, 2018, Webpage available at : https://www.americansemi.com/.

Diedenhofen et al., "Integrated Colloidal Quantum Dot Photodetectors With Color-Tunable Plasmonic Nanofocusing Lenses", Light: Science & Applications, vol. 4, 2015, pp. 1-6.

Partilal European Search Report received for corresponding European Patent Application No. 16175572.3, dated Feb. 9, 2017, 10 pages.

Yan et al., "High-Throughput Fabrication of Micrometer-Sized Compound Parabolic Mirror Arrays by Using Parallel Laser Direct-Write Processing", Journal of Optics, vol. 17, No. 7, 2015, pp. 1-6.

European Search Report received for corresponding European Patent Application No. 16175572.3, dated May 11, 2017, 24 pages.

International Search Report and Written Opinion received for corresponding Patent Cooperation Treaty Application No. PCT/FI2017/050441, dated Nov. 27, 2017, 30 pages.

* cited by examiner

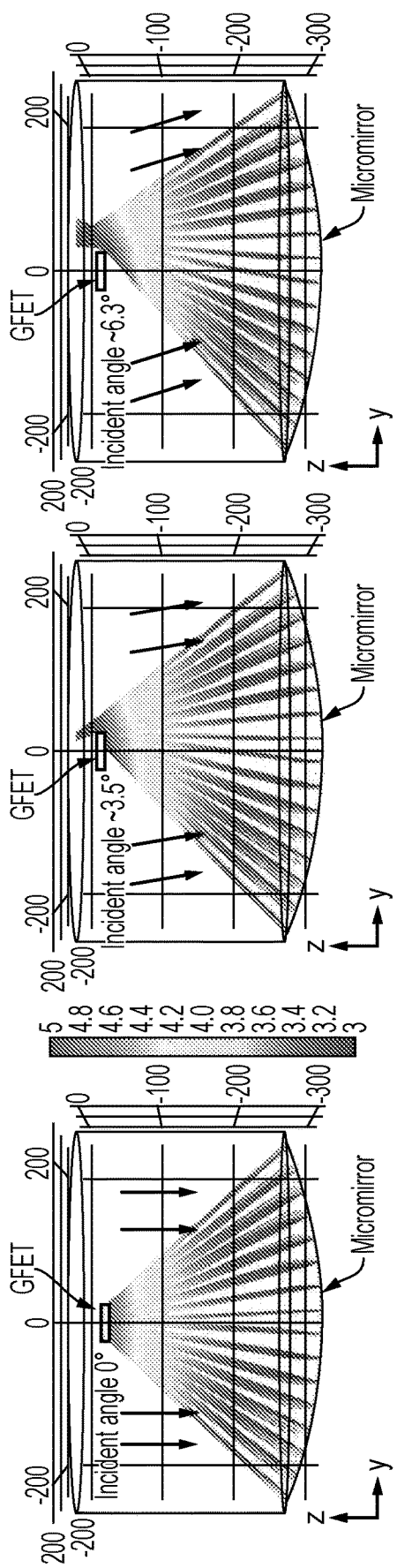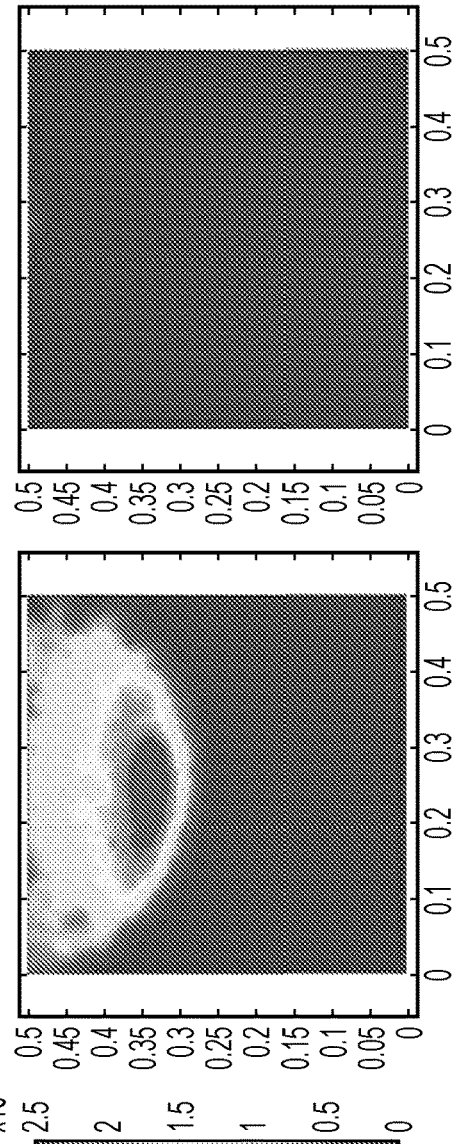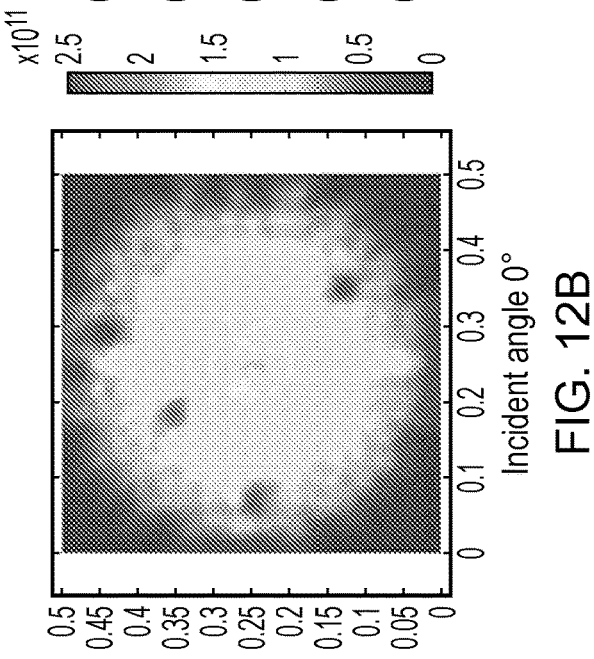
FIG. 12A  FIG. 12C  FIG. 12E
FIG. 12B  FIG. 12D  FIG. 12F

APPARATUS FOR SENSING ELECTROMAGNETIC RADIATION INCIDENT SUBSTANTIALLY PERPENDICULAR TO THE SURFACE OF A SUBSTRATE

RELATED APPLICATION

This application was originally filed as PCT Application No. PCT/FI2017/050441 filed Jun. 14, 2017 which claims priority benefit from EP Patent Application No. 16175572.3 filed Jun. 21, 2016.

TECHNOLOGICAL FIELD

Examples of the disclosure relate to an apparatus and method of forming an apparatus for sensing electromagnetic radiation. In particular, examples of the disclosure relate to an apparatus and method of forming an apparatus for sensing electromagnetic radiation using a two dimensional material such as graphene.

BACKGROUND

Apparatus which are arranged to detect electromagnetic radiation are known. Such apparatus may be used as detectors or photovoltaic devices. It is useful to provide improvements to such devices.

BRIEF SUMMARY

According to various, but not necessarily all, examples of the disclosure there is provided an apparatus comprising: a transparent substrate; a sensor arranged to detect electromagnetic radiation wherein the sensor comprises two dimensional material and the sensor is mounted on the transparent substrate; and a reflective surface arranged to reflect electromagnetic radiation that has passed through the transparent substrate; wherein the reflective surface is arranged to: focus onto the sensor electromagnetic radiation that has passed through the transparent substrate at an angle perpendicular to the surface of the transparent substrate; and not focus onto the sensor electromagnetic radiation that has passed through the transparent substrate at an angle not perpendicular to the surface of the transparent substrate.

The reflective surface may comprise at least one of; a parabolic mirror, a Fresnel mirror, a hexagonal parabolic mirror.

The two dimensional material may comprise graphene. The sensor may comprise a field effect transistor. The sensor may comprise a quantum dot functionalised graphene field effect transistor. The field effect transistor may be arranged so that a first electrode is enclosed by a second electrode.

The apparatus may comprise a plurality of sensors and a plurality of reflective surfaces wherein each of the plurality of sensors is associated with a different reflective surface so that different reflective surfaces reflect electromagnetic radiation onto different sensors.

The sensor may be arranged to detect at least one of; visible light, x-rays.

The sensor may be arranged to be moved relative to the reflective surface.

A first sensor may be provided on a first side of the transparent substrate and an auxiliary sensor may be provided on the second side of the transparent substrate.

The transparent substrate may comprise a flat surface.

The transparent substrate may comprise a curved surface.

The apparatus may comprise a scintillator overlaying the transparent substrate.

The transparent substrate and the reflective surface may be flexible.

According to various, but not necessarily all, examples of the disclosure there is provided a sensing device comprising an apparatus as claimed in any preceding claim.

According to various, but not necessarily all, examples of the disclosure there is provided a method comprising: providing a transparent substrate; providing a sensor arranged to detect electromagnetic radiation wherein the sensor comprises two dimensional material and the sensor is mounted on the transparent substrate; and providing a reflective surface arranged to reflect electromagnetic radiation that has passed through the transparent substrate; wherein the reflective surface is arranged to: focus onto the sensor electromagnetic radiation that has passed through the transparent substrate at an angle perpendicular to the surface of the transparent substrate; and not focus onto the sensor electromagnetic radiation that has passed through the transparent substrate at an angle not perpendicular to the surface of the transparent substrate.

The reflective surface may comprise at least one of; a parabolic mirror, a Fresnel mirror, a hexagonal parabolic mirror.

The two dimensional material may comprise graphene. The sensor may comprise a field effect transistor. The sensor may comprise a quantum dot functionalised graphene field effect transistor.

The method may comprise arranging the field effect transistor so that a first electrode is enclosed by a second electrode.

The method may comprise providing a plurality of sensors and a plurality of reflective surfaces wherein each of the plurality of sensors is associated with a different reflective surface so that different reflective surfaces reflect electromagnetic radiation onto different sensors.

The sensor may be arranged to detect at least one of; visible light, x-rays.

The method may comprise arranging the sensor to be moved relative to the reflective surface.

A first sensor may be provided on a first side of the transparent substrate and an auxiliary sensor may be provided on the second side of the transparent substrate.

The transparent substrate may comprise a flat surface.

The transparent substrate may comprise a curved surface.

The method may comprise providing a scintillator overlaying the transparent substrate.

The transparent substrate and the reflective surface may be flexible.

According to various, but not necessarily all, examples of the disclosure there may be provided examples as claimed in the appended claims.

BRIEF DESCRIPTION

For a better understanding of various examples that are useful for understanding the detailed description, reference will now be made by way of example only to the accompanying drawings in which:

FIG. 12A to 12F illustrates example results obtained using an apparatus.

DETAILED DESCRIPTION

Figure 1:
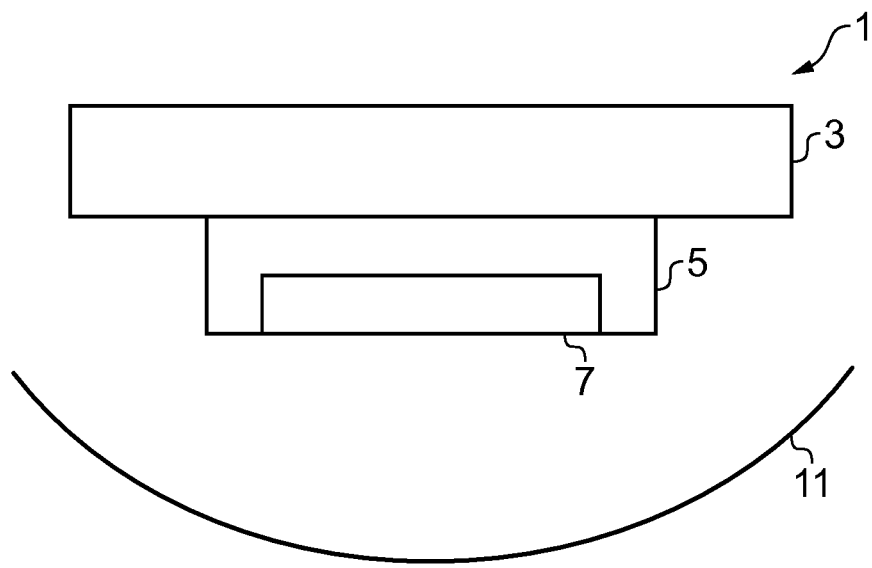
FIG. 1 illustrates an apparatus.

The Figures illustrate an apparatus 1 comprising: a transparent substrate 3, a sensor 5 arranged to detect electromagnetic radiation 9 wherein the sensor 5 comprises two dimensional material 7 and the sensor 5 is mounted on the transparent substrate 3; and a reflective surface 11 arranged to reflect electromagnetic radiation 9 that has passed through the transparent substrate 3 onto the sensor 5.

The apparatus 1 may be for sensing electromagnetic radiation 9 such as visible light or x-rays or any other suitable type of electromagnetic radiation 9. In some examples the apparatus 1 may be used for imaging. In some examples the apparatus 1 may be used for imaging parts of a user's body. For instance the apparatus 1 could be used for vein mapping or any other suitable purpose.

FIG. 1 schematically illustrates an apparatus 1 according to examples of the disclosure. The apparatus 1 comprises a substrate 3, a sensor 5 and a reflective surface 11. The apparatus 1 may comprise other components in other examples of the disclosure.

The substrate 3 may be transparent or at least partially transparent to electromagnetic radiation 9. In some examples the substrate 3 may be transparent to electromagnetic radiation 9 having a particular wavelength or range of wavelengths. For example, the substrate 3 may be transparent to electromagnetic radiation 9 in the visible range of the spectrum but might not be transparent to electromagnetic radiation 9 outside of this range. In such examples the substrate 3 may act as a filter to remove electromagnetic radiation outside of the desired range.

The substrate 3 may comprise any suitable material such as plastic or glass. The glass could be a flexible glass. The plastic could comprise polyethylene naphthalate (PEN), polyethylene terephthalate (PET) or any other suitable plastic.

In the example of FIG. 1 the substrate 3 is flat or substantially flat. Both the upper surface and the lower surface of the substrate 3 are flat. It is to be appreciated that the substrate 3 could have other shapes and configurations in other examples of the disclosure. For instance, in some examples the substrate 3 may be a curved substrate 3. In some examples the substrate 3 could be a flexible substrate which could be arranged into any suitable configuration.

The substrate 3 may provide a support for a sensor 5 so that one or more sensors 5 may be mounted on the substrate 3. In some examples the sensor 5 may be fabricated on the substrate 3.

The example apparatus 1 of FIG. 1 comprises one sensor 5. It is to be appreciated that any number of sensors 5 may be provided in other examples of the disclosure.

The sensor 5 may comprise any means which may be arranged to detect electromagnetic radiation 9. The sensor 5 may comprise any means which may be arranged to provide an electrical output in response to incident electromagnetic radiation on the sensor 5.

In the example apparatus 1 of FIG. 1 the sensor 5 comprises two dimensional material 7. The two dimensional material 7 may comprise a very thin layer of material. In some examples the two dimensional material 7 could be an atomic monolayer. In some examples the two dimensional material 7 could comprise several atomic monolayers. The two dimensional material 7 could comprise graphene or any other suitable material.

In some examples the two dimensional material 7 may comprise functionalized graphene. The graphene could be functionalized using quantum dots, metallic nanoparticles or any other suitable means. The means that is used to functionalize the graphene may depend on the wavelength of electromagnetic radiation 9 that the sensor 5 is arranged to detect.

The two dimensional material 7 may be arranged to enable an electrical output to be provided in response to incident electromagnetic radiation 9. In some examples the two dimensional material 7 may be provided as a channel in a field effect transistor. In such examples the two dimensional material 7 may be provided between a source electrode and a drain electrode. The electrodes may be formed on the substrate 3. In some examples the electrodes may be formed from a transparent conductive material such as indium tin oxide (ITO) or any other suitable material. This ensures that the electromagnetic radiation 9 can pass through the electrodes as needed.

In the example apparatus 1 of FIG. 1 the sensor 5 is mounted on the lower surface of the substrate 3. The sensor 5 is provided on the same side of the substrate 3 as the reflective surface 11. In other examples the sensor 5 could be mounted on the upper surface of the substrate 3.

In some examples the sensor 5 may be shielded so that only electromagnetic radiation 9 that is incident on the sensor 5 from the lower side of the substrate 5 is detected by the sensor 5. The shield may comprise any suitable material which provides a barrier to electromagnetic radiation 9. In the example of FIG. 1 the shield may be provided between the sensor 5 and the substrate 3. In other examples where the sensor 5 is mounted on an upper surface of the substrate 3 the shield may be provided overlaying the sensor 5.

The reflective surface 11 is positioned underneath the sensor 5. The reflective surface 11 may comprise any optical means, such as a mirror, which may be arranged to reflect electromagnetic radiation 9. In some examples the reflective surface 11 may be arranged to reflect electromagnetic radiation 9 within a given range of wavelengths. For instance the reflective surface 11 may be arranged to reflect visible light.

The reflective surface 11 may be formed by any suitable methods. In some examples the reflective surface 11 may be formed by depositing a reflective material onto a flexible surface. The flexible surface may comprise any suitable material such as plastic. The highly reflective material could comprise any suitable material such as aluminium or silver.

The reflective surface 11 and the transparent substrate 3 may be coupled together to form the apparatus 1. In some examples the reflective surface 11 and the transparent substrate 3 may be laminated together.

The reflective surface 11 is positioned within the apparatus 1 so that electromagnetic radiation 9 that passes through the transparent substrate 3 is incident on the reflective surface 11. At least some of the electromagnetic radiation 9 that is incident on the reflective surface 11 is directed onto the sensor 5.

The reflective surface 11 is shaped and positioned relative to the sensor 5 so that electromagnetic radiation 9 that was incident on the substrate 3 at a given angle or range of angles is directed onto the sensor 5. In some examples the reflective surface 11 may be arranged to reflect electromagnetic radiation 9 that was incident on the substrate 3 perpendicular or substantially perpendicular to the surface of the substrate 3 onto the sensor 5.

In some examples of the disclosure the reflective surface 11 may be a parabolic or substantially parabolic shape. In such examples the reflective surface 11 may be arranged so that electromagnetic radiation 9 that is incident on the apparatus 1 perpendicular or substantially perpendicular to the surface of the substrate 3 is reflected towards the focus of the parabola. Electromagnetic radiation 9 that is incident on the apparatus 1 at angles that are not perpendicular to the surface of the substrate 3 are not reflected towards the focus. By positioning the sensor 5 at the focus of the parabola or close to the focus this ensures that electromagnetic radiation 9 that is incident on the apparatus 1 at an angle perpendicular to the substrate 3 is directed onto the sensor 5. Other shapes of reflective surface 11 and/or positions of the sensor 5 may be used in other examples of the disclosure.

It is to be appreciated that by having the sensor 5 at a different position relative to the sensor 5 and/or by using different shaped reflective surfaces 11 the apparatus 1 may be arranged to detect electromagnetic radiation that was incident on the apparatus 1 at an angle other than perpendicular to the apparatus 1.

Figure 2:
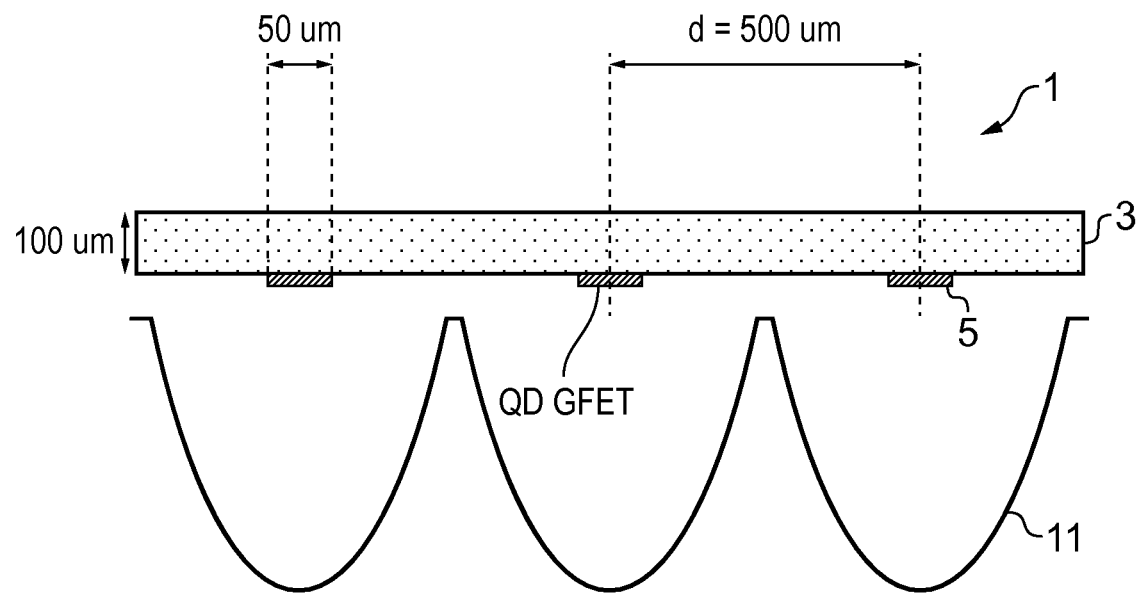
FIG. 2 illustrates an apparatus.

FIG. 2 schematically illustrates an apparatus 1 according to another example of the disclosure. In the example of FIG. 2 the apparatus 1 comprises a substrate 3, a plurality of sensors 5 and a plurality of reflective surfaces 11.

The substrate 3 may be a transparent substrate 3 which may be as described above. In the example of FIG. 2 the substrate 3 is a thin substrate. In the example of FIG. 2 the substrate 3 has a thickness of 100 µm. Substrates 3 having different thicknesses may be used in other examples of the disclosure.

The plurality of sensors 5 may each be as described above. Each of the sensors 5 may be arranged to detect electromagnetic radiation 9 of the same wavelength or range of wavelengths.

In the example of FIG. 2 three sensors 5 are shown. It is to be appreciated that any number of sensors 5 could be provided in other examples of the disclosure.

In the example of FIG. 2 the three sensors 5 are arranged in a straight line. It is to be appreciated that any suitable arrangement of the sensors 5 may be used in other examples of the disclosure. For instance the sensors 5 may be arranged in an array comprising a plurality of rows and columns. The arrangement of the sensors 5 may be dependent upon the shapes and/or sizes of the reflective surfaces 11 or any other suitable factors.

In the example of FIG. 2 all of the sensors are mounted on the same surface of the substrate 3. In the example of FIG. 2 the sensors 5 are provided on the lower surface of the substrate 3. In some examples the sensors 5 could be provided on the upper surface of the substrate 3. In other examples some of the sensors 5 could be provided on the upper surface of the substrate 3 and some of the sensors 5 could be provided on the lower surface of the substrate 3.

In the example of FIG. 2 the sensors 5 have a width of 50 µm. A spacing of 500 µm is provided between adjacent sensors 5. It is to be appreciated that other sized sensors 5 and other spacings between the sensors 5 could be used in other examples of the disclosure. The spacing between the sensors 5 may be several times larger than the size of the sensors 5. The size of the sensors 5 may be selected based on an optimization between the surface area needed to detect the reflected electromagnetic radiation 9 and reducing the amount of noise within the signal.

The apparatus 1 also comprises a plurality of reflective surfaces 11. The reflective surfaces 11 may be as described above. In the example of FIG. 2 the number of reflective surfaces 11 is the same as the number of sensors 5. The plurality of reflective surfaces 11 may be provided in an array. The positions of the reflective surfaces 11 within the array may correspond to the array of sensors 5. This ensures that a reflective surface 11 is provided for each of the sensors 5 within the apparatus 1. Each of the plurality of sensors 5 is associated with a different reflective surface 11 so that different reflective surfaces 11 reflect electromagnetic radiation 9 onto different sensors 5.

In the example of FIG. 2 each of the reflective surfaces 11 has a parabolic shape. Other shapes may be used in other examples of the disclosure.

In the example of FIG. 2 the diameter of each reflective surface 11 is approximately 500 µm. A sensor 5 is positioned at the centre of the diameter of each reflective surface 11, which will be the focus or close to the focus of each reflective surface 11. Other arrangements of sensors 5 and reflective surfaces 11 may be used in other examples of the disclosure.

Figure 3:
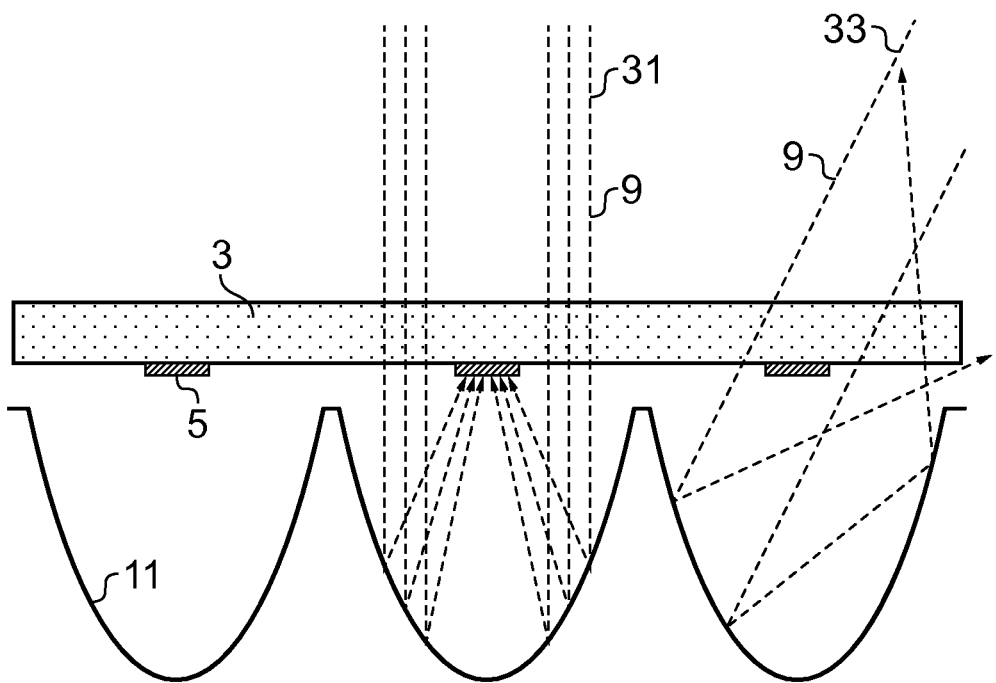
FIG. 3 illustrates electromagnetic radiation incident on an apparatus.

FIG. 3 schematically illustrates electromagnetic radiation 9 incident on an apparatus 1. The apparatus 1 may be the same as the apparatus 1 of FIG. 2. It is to be appreciated that other apparatus 1 may be used in other examples of the disclosure.

FIG. 3 shows the paths taken by electromagnetic radiation 9 that is incident on the apparatus 1 from different directions.

The arrows 31 represent electromagnetic radiation 9 that is incident on the apparatus 1 at an angle which is perpendicular or substantially perpendicular to the surface of the substrate 3. The electromagnetic radiation 9 passes though the transparent substrate 3 and is incident on the reflective surface 11 which is positioned adjacent to the lower surface of the substrate 3.

As shown in FIG. 3 the electromagnetic radiation comprises parallel rays when it is incident on the reflective surface 11. The reflective surface 11 redirects the electromagnetic radiation 9 so that it is directed onto the sensor 5. As the reflective surface 11 has a parabolic shape and the sensor 5 is positioned at or close to the focus of the parabola any electromagnetic radiation 9 that passes through the substrate 3 at a perpendicular angle will be directed onto the sensor 5.

The arrows 33 represent electromagnetic radiation 9 that is incident on the apparatus 1 at an angle which is not perpendicular or substantially perpendicular to the surface of the substrate 3. The electromagnetic radiation 9 which is not perpendicular to the substrate 3 also passes though the transparent substrate 3 and is incident on the reflective surface 11 which is positioned adjacent to the lower surface of the substrate 3.

As shown in FIG. 3 the reflective surface 11 reflects the electromagnetic radiation 9 which is incident on the apparatus 1 from a direction other than the perpendicular direction but does not direct it onto the sensor 5 because of the angle of incidence of the electromagnetic radiation 9.

Therefore the reflective surface 11 is arranged so that only electromagnetic radiation 9 which was incident on the apparatus at a perpendicular angle or angle close to the perpendicular is reflected onto the sensors 5. This may enable the electromagnetic radiation 9 to be focussed onto the sensors 5 without the use of any additional optical components such as lenses or micro lenses. This may enable focussed images to be obtained by the apparatus 1. As the electromagnetic radiation 9 is independently focussed onto each of the lenses this enables the image to be focussed across the array of sensors 5.

For clarity only electromagnetic radiation 9 that is incident on the apparatus from a perpendicular direction is shown on the central sensor 5 and reflective surface 11 and only electromagnetic radiation 9 that is incident on the apparatus 1 from a direction other than the perpendicular direction is shown on the right hand sensor 5 and reflective surface 11. It is to be appreciated that electromagnetic radiation 9 could be incident from any angle.

In the example of FIG. 3 the apparatus 1 is arranged so that electromagnetic radiation 9 incident on the apparatus 1 at an angle which is perpendicular or substantially perpendicular is directed onto the sensors 5. In other examples the apparatus 1 could be arranged so that electromagnetic radiation 9 incident on the apparatus 1 at an angle which is not perpendicular or substantially perpendicular is directed onto the sensors 5.

Figure 4:
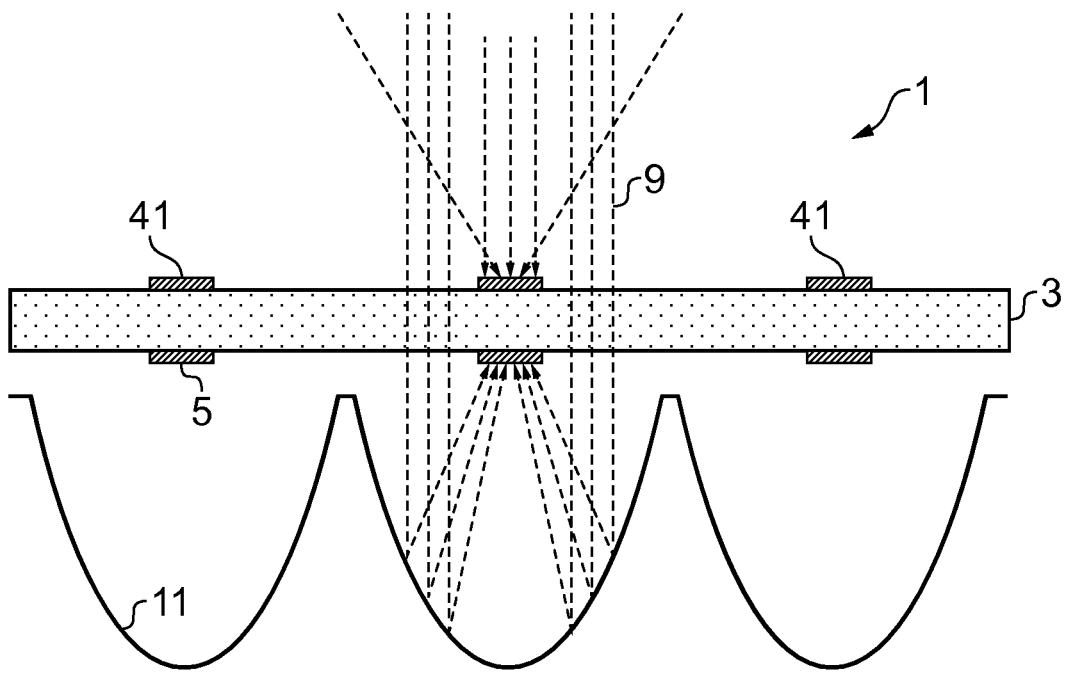
FIG. 4 illustrates an apparatus.

FIG. 4 schematically illustrates another apparatus 1 according to examples of the disclosure. The apparatus 1 comprises a transparent substrate 3, a plurality of sensors 5 and a plurality of reflective surfaces 11 which may be as described above. In the example of FIG. 4 the apparatus 1 also comprises a plurality of auxiliary sensors 41. In FIG. 4 three sensors 5 and three auxiliary sensors 41 are shown. It is to be appreciated that any number of sensors 5 and auxiliary sensors 41 could be provided in other examples of the disclosure.

In the example of FIG. 4 the plurality of sensors 5 are provided as an array on the lower surface of the substrate 3. The plurality of reflective surfaces 11 are provided on the same side of the sensor as the plurality of sensors 5.

The plurality of auxiliary sensors 41 are also provided on the substrate 3. The plurality of secondary sensors 41 are provided on a different surface of the transparent substrate 3 to the sensors 5. In the example of FIG. 4 the plurality of auxiliary sensors 41 are provided on the upper surface of the substrate 3. In some examples the auxiliary sensors 41 may be fabricated on the substrate 3. The auxiliary sensors 41 and the sensors 5 could be fabricated on the substrate 3 as part of a single fabrication process.

In the example of FIG. 4 the same number of sensors 5 and auxiliary sensors 41 are provided. In other examples the numbers of sensors 5 and the numbers of auxiliary sensors 41 could be different.

In the example of FIG. 4 the auxiliary sensors 41 are positioned on the upper surface of the substrate 1 so that the auxiliary sensors overlay, or at least partially overlay the sensors 5. In such examples the array of the auxiliary sensors 41 may have the same arrangement as the array of the sensors 5. In other examples the auxiliary sensors 41 could be positioned at different locations relative to the sensors 5.

The plurality of auxiliary sensors 41 may be arranged to detect electromagnetic radiation 9. The plurality of auxiliary sensors 41 may also comprise two dimensional material 7 such as graphene. In some examples the plurality of auxiliary sensors 41 may be the same as sensors 5. The plurality of auxiliary sensors 41 may be arranged to detect electromagnetic radiation 9 of the same wavelength or range of wavelengths as the electromagnetic radiation 9 detected by the sensors 5. In other examples the auxiliary sensors 41 may be arranged to detect electromagnetic radiation 9 having different wavelength or range of wavelengths compared to the electromagnetic radiation 9 detected by the sensors 5.

In the example of FIG. 4 the sensors 5 are arranged to detect electromagnetic radiation 9 that has passed through the substrate 3 and been reflected by the reflective surface 11. The auxiliary sensors 41 are arranged to detect electromagnetic radiation 9 that has not passed through the substrate 3. The auxiliary sensors 41 may be shielded so that they do not detect electromagnetic radiation 9 that has been reflected by the reflective surface 11.

The auxiliary sensors 41 provide an output signal which is indicative of the electromagnetic radiation 9 which is incident from all directions whereas the sensors 5 only provide an output signal which is indicative of the electromagnetic radiation 9 which is incident at a perpendicular angle. This arrangement may be used to obtain information about the proportion of electromagnetic radiation 9 which is arriving from the perpendicular direction compared to all other directions.

In the example of FIG. 4 the apparatus 1 is arranged so that the sensors 5 detect electromagnetic radiation 9 that is incident perpendicular to the surface of the substrate 3. In other examples the apparatus 1 may be arranged so that the sensors 5 detect electromagnetic radiation 9 that is incident from other angles.

Figure 5:
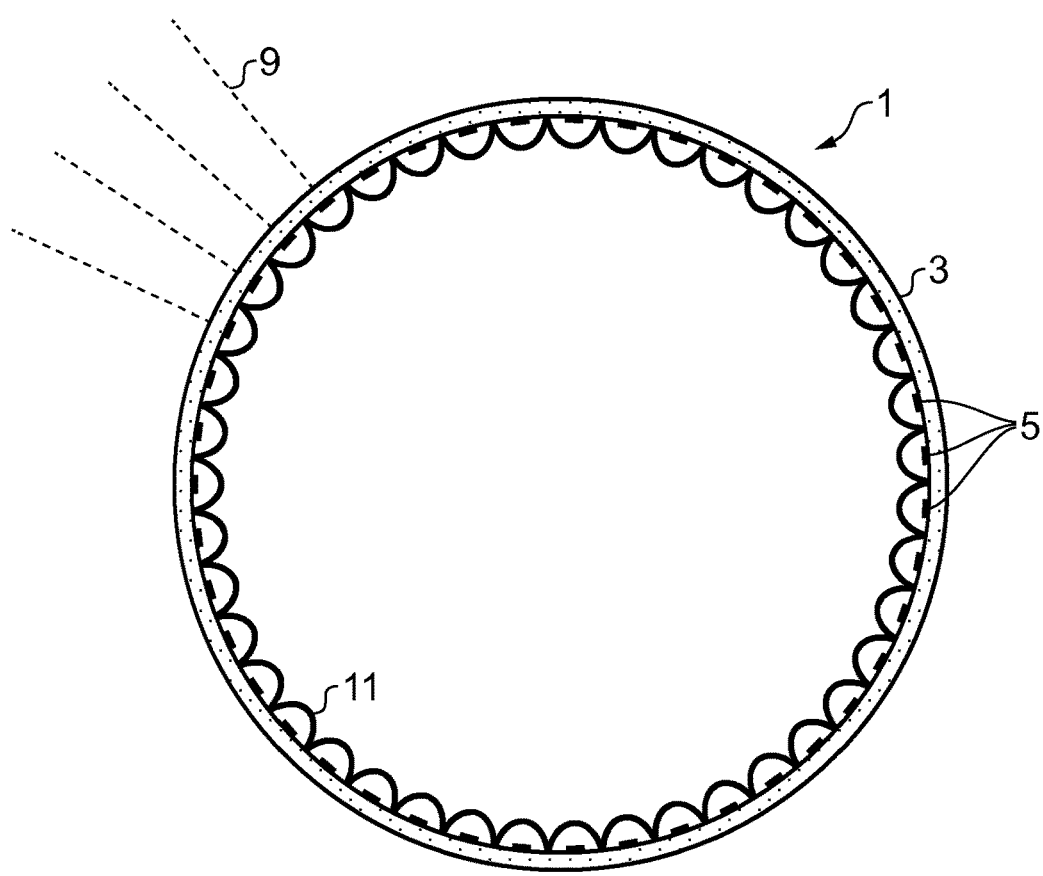
FIG. 5 illustrates an apparatus comprising a curved substrate.

FIG. 5 schematically illustrates an apparatus 1 comprising a curved substrate 3. The apparatus 1 also comprises a plurality of sensors 5 and a plurality of reflective surfaces 11 which may be as described above.

In the example of FIG. 5 the substrate 3 is arranged into a circular shape. In some examples the substrate 3 may be spherical or cylindrical and the circle shown in FIG. 5 may represent a cross section through the sphere or the circle. In such examples the sensors 5 may be provided over the surface of the sphere or the circle. In some examples the sensors 5 may be arranged to cover all of, or almost all of, the surface of the sphere or cylinder. Other shapes may be used in other examples of the disclosure.

The reflective surfaces 11 are also provided in a circular shape. The reflective surfaces 11 are provided on the inner circumference of the substrate 3 so that incident electromagnetic radiation 9 passes through the substrate 3 before it is incident on the reflective surfaces 11.

The reflective surfaces 11 extend around the entire inner circumference of the substrate 3. In other examples the reflective surfaces 11 may only be provided for a section or sections of the substrate 3.

A plurality of sensors 5 are also provided in the example apparatus 1 of FIG. 5. The sensors 5 are provided on the inner surface of the substrate 3. The sensors 5 are provided on the same side of the substrate 3 as the reflective surfaces 11. In the example of FIG. 5 the number of reflective surfaces 11 is the same as the number of sensors 5 so that a reflective surface 11 is provided for each of the sensors 5 within the apparatus 1. Each of the plurality of sensors 5 is associated with a different reflective surface 11 so that different reflective surfaces 11 reflect electromagnetic radiation 9 onto different sensors 5.

The curved substrate 3 enable the apparatus 1 to provide enhanced directional selectivity compared to an apparatus 1 with a flat substrate 3. Each of the sensors 5 may be arrange to detect electromagnetic radiation 9 that is incident on the substrate 9 at a perpendicular or substantially perpendicular angle at the point above the sensor 5.

In examples where the size of the sensor 5 is 50 μm and the spacing between adjacent sensors is 500 μm the field of view for a single sensor 5 would be approximately 12°. The radius of curvature of the substrate 3 may be arranged so that the field of view of adjacent sensors 5 does not overlap. This enables the apparatus 1 to distinguish between electromagnetic radiation 9 that is incident from different angles.

Figure 6:
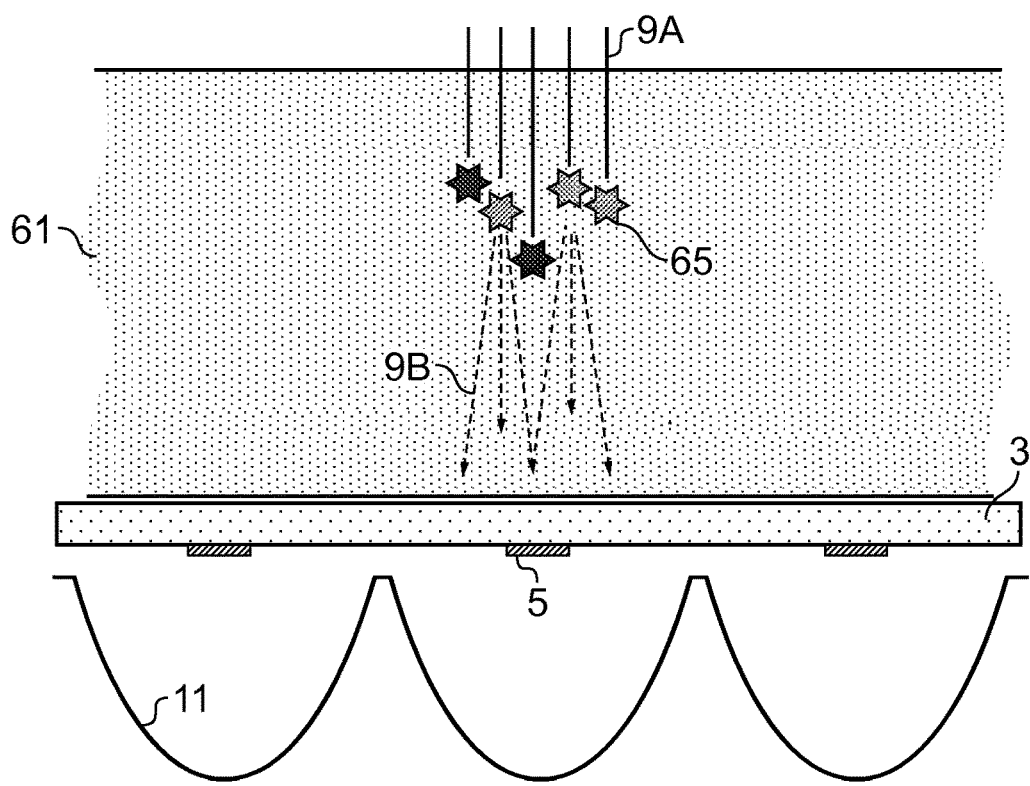
FIG. 6 illustrates an apparatus comprising a scintillator.

FIG. 6 schematically illustrates another apparatus 1 according to examples of the disclosure. The apparatus 1 of FIG. 6 may be arranged to detect x-rays. The example apparatus of FIG. 6 comprises a substrate 3, a plurality of sensors 5 and a plurality of reflective surfaces 11. The substrate 3, sensors 5 and reflective surfaces 11 may be as described above in relation to FIGS. 2 and 3. It is to be appreciated that other arrangements may be used in other examples of the disclosure.

The example apparatus 1 of FIG. 6 also comprises a scintillator 61. The scintillator 61 may comprise any means which may be arranged to convert 65 incident x-rays 9A into electromagnetic radiation 9B with a different wavelength. The scintillator 61 may convert 65 the incident x-rays 9A into electromagnetic radiation 9B with a wavelength that can be detected by the sensors 5 of the apparatus 1. In some examples the scintillator 61 may convert 65 the incident x-rays 9A into electromagnetic radiation 9B with a wavelength in the visible range of the spectrum.

The scintillator 61 is provided overlaying the transparent substrate 3 so that electromagnetic radiation 9B that is emitted by the scintillator 61 may pass through the substrate 3.

The x-rays 9A that are incident on the scintillator 61 may be perpendicular to the surface of the scintillator 61. When the x-rays 9A are converted 65 to electromagnetic radiation 9B with a different wavelength the electromagnetic radiation 9B with a different wavelength may be emitted omnidirectionally. However as only electromagnetic radiation 9B that is incident on the substrate 3 at a perpendicular angle will be directed on the sensor 5 this means that only the electromagnetic radiation 9B that is emitted in a direction perpendicular to the substrate 3 will be detected by the sensors 5. This enables high spatial resolution of an x-ray detector to be achieved without the use of a columnar scintillator structure as only the electromagnetic radiation 9B generated by the scintillator that arrives perpendicular to the substrate 3 is received by the sensor 5.

Figure 7A:
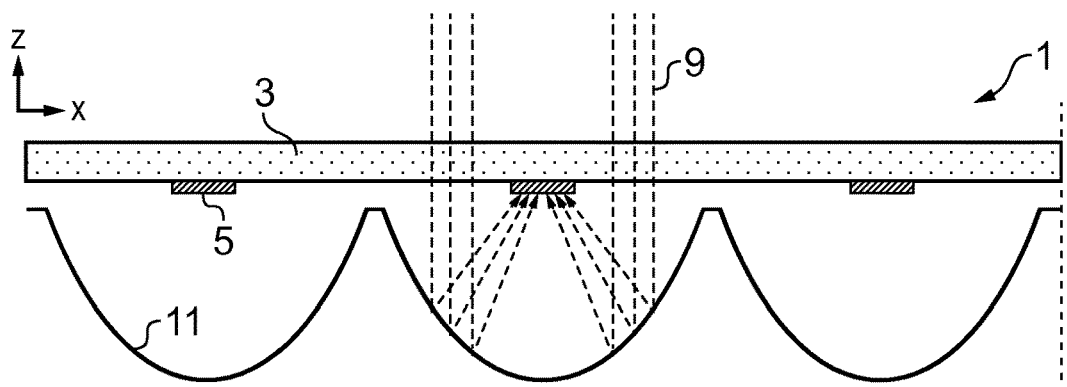
FIGS. 7A to 7C illustrate an apparatus with a moveable sensor.
Figure 7B:
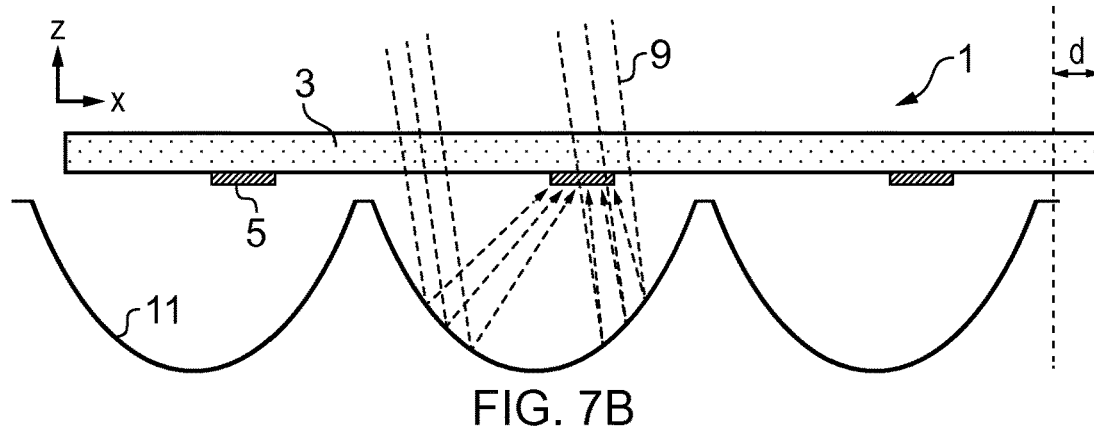
Figure 7C:
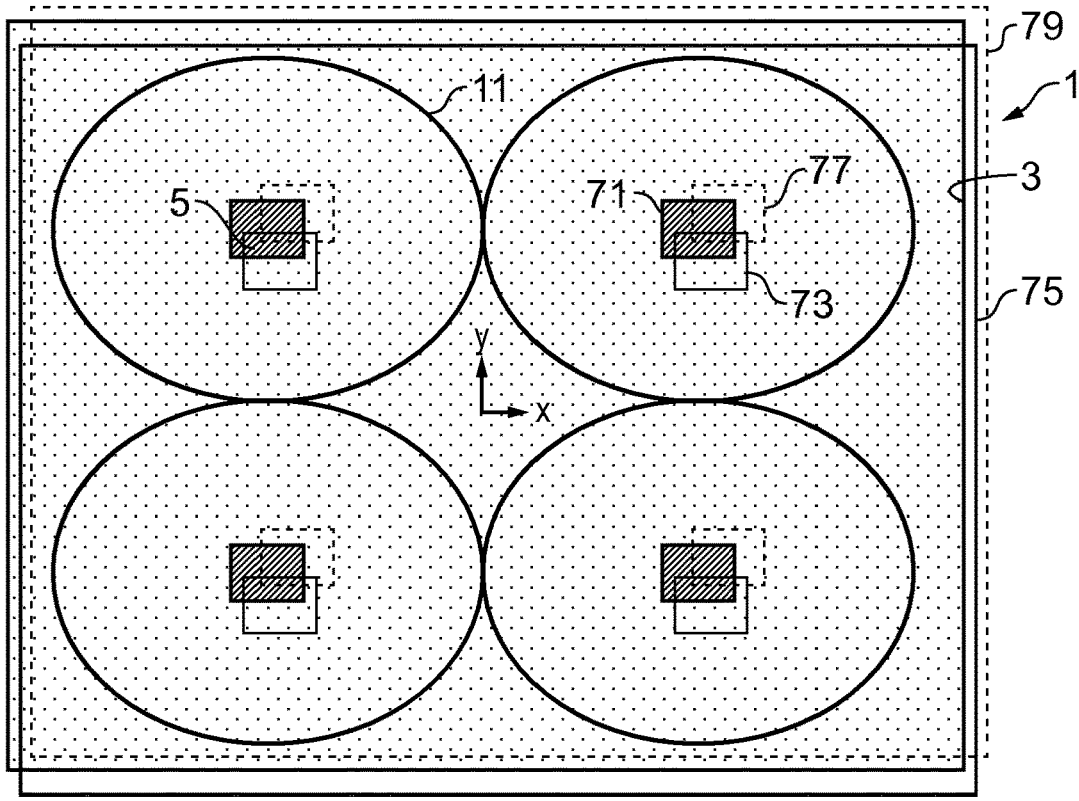

FIGS. 7A to 7C schematically illustrate another apparatus 1 according to examples of the disclosure. The example apparatus of FIGS. 7A to 7C comprises a substrate 3, a plurality of sensors 5 and a plurality of reflective surfaces 11. The substrate 3, sensors 5 and reflective surfaces 11 may be as described above in relation to FIGS. 2 and 3. It is to be appreciated that other arrangements may be used in other examples of the disclosure.

In the examples of FIG. 7A to 7C the apparatus 1 is arranged so that the sensors 5 may be moved relative to the reflective surface 11. FIG. 7A illustrates a cross section of an apparatus 1 with the sensors 5 in a first position, FIG. 7B illustrates a cross section of the apparatus 1 with the sensors 5 in a second position and FIG. 7C illustrates a plan view of a section of the apparatus 1 with different positions of the sensors 5.

In the arrangement of FIG. 7A the sensors 5 are positioned in the centre of the reflective surfaces 11. In examples where the reflective surface 11 comprises a parabola the sensor 5 may be positioned at the focus or close to the focus of the parabola. This may enable electromagnetic radiation 9 which is incident on the apparatus 1 at a perpendicular angle to be directed onto the sensor 5.

In the arrangement of FIG. 7B the sensors 5 have been moved relative to the reflective surfaces 11. In the example of FIGS. 7A to 7C the sensors 5 may be moved by moving the substrate 3 relative to the reflective surfaces 11. When the substrate 3 is moved all of the sensors 5 that are mounted on the substrate 3 are moved.

In the arrangement of FIG. 7B the substrate 3 has been moved by a distance d in the x direction. This has moved the substrate 3 and all of the sensors 5 laterally relative to the reflective surfaces 11. In the arrangement of FIG. 7B each of the sensors is now positioned to the right of the focus of the parabola. As the sensors 5 are no longer positioned at the focus or close to the focus of the parabolic reflective surface 11 electromagnetic radiation 9 which is incident on the apparatus 1 at a perpendicular angle is no longer directed onto the sensor 5. Instead electromagnetic radiation 9 which is incident on the apparatus 1 at a different angle is directed onto the sensors 5 as indicated in FIG. 7B. It is to be appreciated that by moving the sensors 5 to different positions electromagnetic radiation 9 having different angles of incidence may be detected by the sensors 5.

FIG. 7C illustrates a plan view of a section of the example apparatus of FIGS. 7A and 7B. The plan view of FIG. 7C shows that the substrate 3 may be moved in the x direction and/or the y direction.

The shaded area represents the sensors 5 when they are located in a first position. In the first position the sensors 5 are aligned with the reflective surfaces 11 so that the sensors 5 are positioned at the centre of the reflective surface 11. This may correspond to the arrangement shown in FIG. 7A. This may enable electromagnetic radiation 9 which is incident at a perpendicular angle to be detected.

The solid lines 73 represent the sensors 5 when they are located in a second position. The solid lines 75 represent the substrate 3 when it has been moved to the second position. In the second position the substrate 3 has been moved towards the positive x direction and towards the negative y direction. In the second position the sensors 5 are no longer positioned in the centre of the reflective surfaces 11. This enables the sensors 5 to detect electromagnetic radiation 9 which is incident at an angle other than the perpendicular.

The dashed lines 77 represent the sensors 5 when they are located in a third position. The dashed lines 79 represent the substrate 3 when it has been moved to the third position. In the third position the substrate 3 has been moved towards the positive x direction and towards the positive y direction. In the third position the sensors 5 are no longer positioned in the centre of the reflective surfaces 11 and are also in a different positioned compared to the second position. This enables the sensors 5 to detect electromagnetic radiation 9 which is incident at another angle other than the perpendicular to be detected. The third position of the sensors 5 may enable electromagnetic radiation 9 to be detected from a different angle to the second position of the sensors 5.

The example apparatus 1 of FIGS. 7A to 7C may enable electromagnetic radiation 9 from any target direction to be detected by moving the sensors 5 to an appropriate position. It is to be appreciated that the example sensor 5 positions in FIGS. 7A to 7C are for illustrative purposes only and that the sensors 5 could be arranged in any suitable positions in other examples of the disclosure. For instance in some examples the sensors 5 could be positioned anywhere from the centre of the reflective surface 11 to the edge of the reflective surface 11.

In the examples of FIGS. 7A to 7C the sensors 5 are moved by laterally moving the substrate 3 relative to the reflective surface 11. The movement of the substrate 3 may be controlled using an electronic device or any other suitable means. The electronic device may control the speed at which the substrate 3 is moved.

In some examples the movement of the sensors 5 may be arranged to enable the apparatus 1 to scan for electromagnetic radiation 9 arriving from different directions. The apparatus 1 may be arranged to obtain a plurality of different measurements at a plurality of different positions.

In some examples the movement of the sensors 5 may be arranged to reduce noise in measurements obtained by the sensors 5. In such examples the apparatus 1 may be arranged so that the substrate 3 can be moved at a high frequency. The high frequency movement may be in the range 1 Hz to 1 kHz. In such examples the read out electronics may be arranged to enable lock-in measurement so that only the signal component having the same frequency as the movement of the substrate 3 is extracted. This way any noisy signals with a frequency lower than or higher than the frequency of the movement of the sensors 5 would not be detected and so would not contribute to the signal provided by the sensor 5.

In the examples of FIGS. 7A to 7C the sensors 5 are all moved by the same amount relative to the reflective surfaces 11. In other examples some sensors 5 could be moved by different amounts. In such examples the substrate 3 may be arranged to be deformed and/or different sensors 5 could be provided on different substrates 3.

Figure 8:
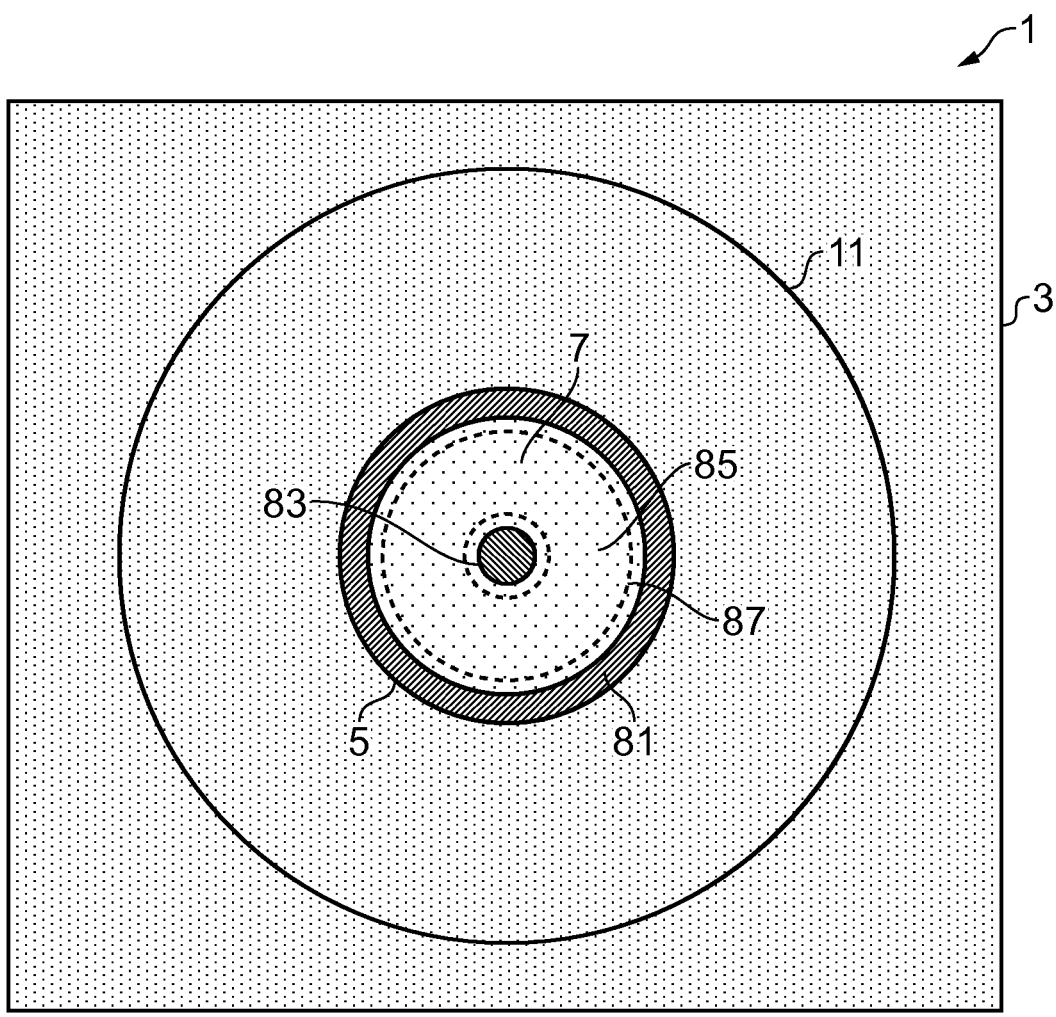
FIG. 8 illustrates an example sensor.

FIG. 8 schematically illustrates an example sensor 5 which may be used in examples of the disclosure. In the example of FIG. 8 the sensor 5 comprises a field effect transistor (FET) such as a graphene field effect transistor (GFET). Other types of transistors or sensors 5 may be used in other examples of the disclosure.

FIG. 8 illustrates a plan view of the sensor 5 on the surface of the substrate 3. The sensor 5 comprises a source electrode 81 and a drain electrode 83. The source electrode 81 and the drain electrode 83 may be formed from any suitable conductive material. In some examples the source electrode 81 and the drain electrode 83 may be formed on the surface of the substrate 3.

In the example of FIG. 8 the drain electrode 83 is provided as a circular portion in the centre of the sensor 5. The source electrode 81 is provided as annular portion which extends around the drain electrode 83. The source electrode 81 also has a circular shape. The source electrode 81 fully encloses the drain electrode 83. In other examples the source electrode 81 might partially enclose the drain electrode 83.

The two dimensional material 7 is provided as a channel 85 between the source electrode 81 and the drain electrode 83. The two dimensional material 7 may comprise graphene, functionalised graphene or any other suitable material.

The sensor 5 also comprises a gate electrode 87. In the example of FIG. 8 the gate electrode 87 is indicated by dashed lines. The gate electrode 87 is positioned underneath the channel 85. The gate electrode 87 may be provided embedded in the substrate 3. The gate electrode 87 also encloses, or at least partially encloses the drain electrode 83.

In the example of FIG. 8 the source electrode 81 encloses the drain electrode 83. It is to be appreciated that in other examples the drain electrode 83 could be provided enclosing the source electrode 81.

The example sensor 5 of FIG. 8 may enable a plurality of FETs to be provided on the same substrate 3. The plurality of FETS could be formed from a single continuous layer of two dimensional material 7. The example layout of the source electrode 81 and the drain electrode 83 may reduce cross talk between adjacent FETs.

In the example of FIG. 8 the source and drain electrodes 81, 83 have a circular shape. The reflective surface 11 may also have a circular shape so that the reflective surface 11 and the sensor 5 have corresponding shapes. This may increase the efficiency of the apparatus 1 as it may ensure that a higher proportion of electromagnetic radiation 9 is reflected onto the sensor 5. In other examples the sensor 5 may have a different shape. For instance, if the reflective surface 11 is a hexagonal parabola then the sensor 5 may be arranged in a hexagonal shape. In other examples the sensor 5 and the reflective surface 11 may have different shapes.

In the examples described above the reflective surface 11 has a parabolic shape. Other shapes may be used in other examples of the disclosure.

Figure 9A:
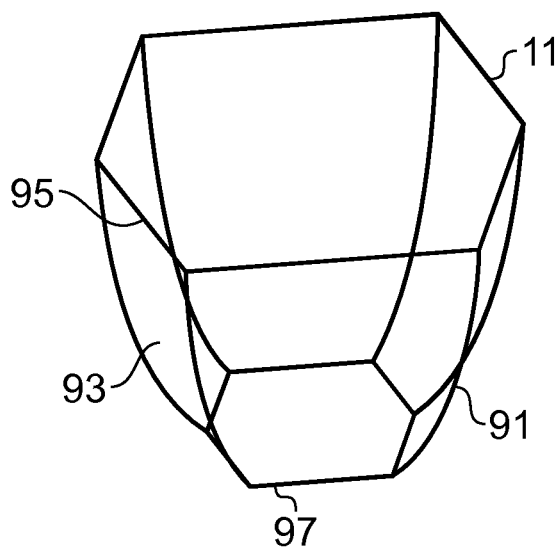
FIGS. 9A to 9C illustrate an apparatus comprising a hexagonal parabolic reflective surface.
Figure 9B:
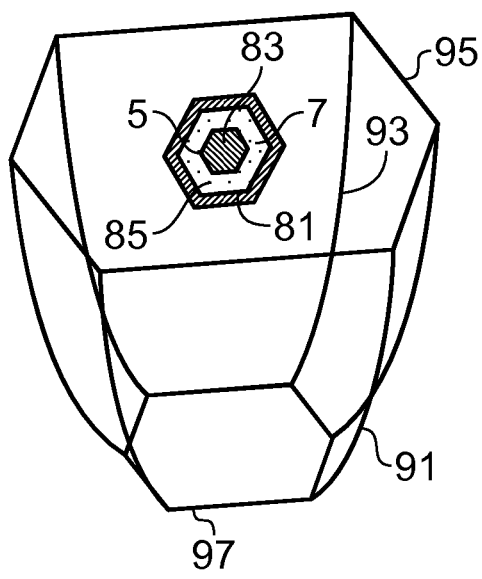
Figure 9C:
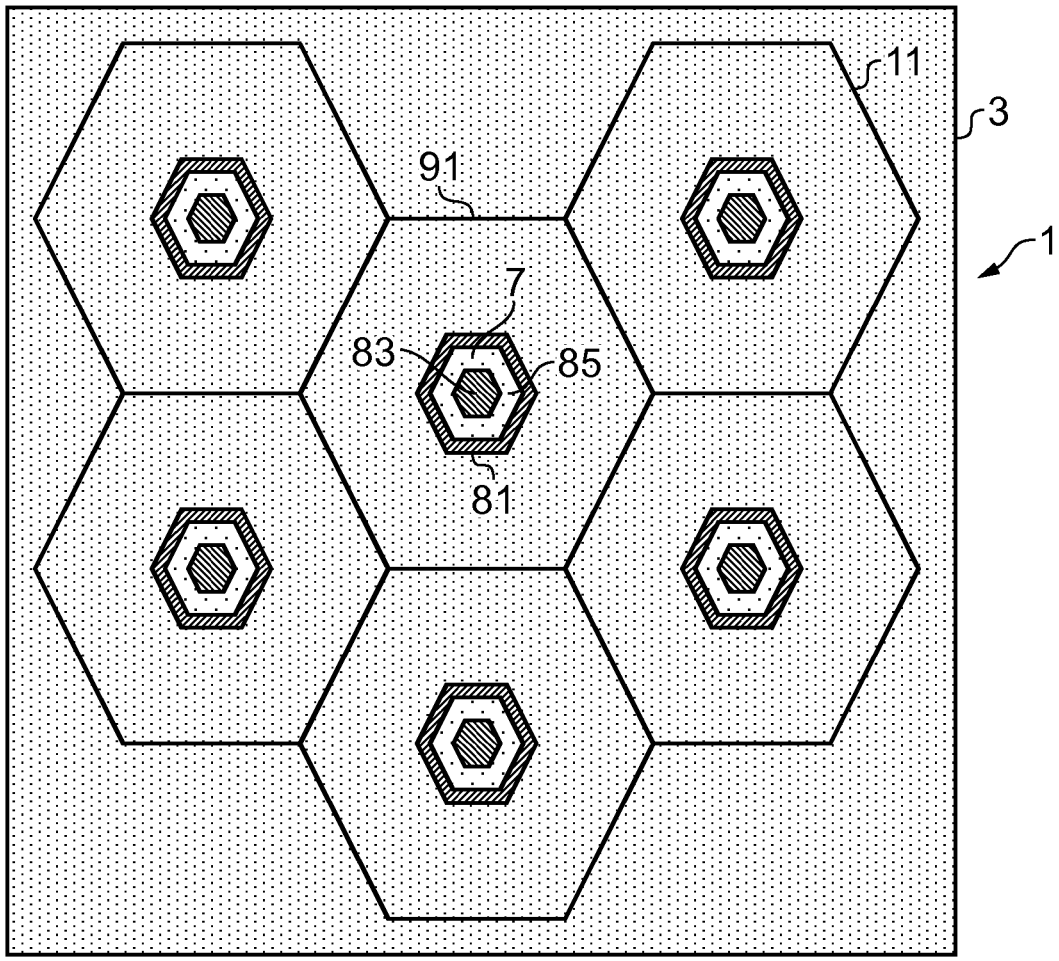

FIGS. 9A to 9C illustrate an apparatus 1 comprising a hexagonal parabolic reflective surface 11.

FIG. 9A illustrates an example of a hexagonal parabola 91. The hexagonal parabola comprises an approximation between a parabola and a hexagon. The hexagonal parabola 91 comprises six curved surfaces 93 arranged in a hexagonal configuration. Each of the curved surfaces 93 has a linear top section 95 so that the perimeter of the reflective surface 11 forms a regular hexagon. The curved surfaces 93 are curved in a substantially parabolic curve so that electromagnetic radiation that is incident from a perpendicular direction or close to a perpendicular direction is reflected towards the centre of the hexagon.

In the example of FIG. 9A a flat surface 97 is provided at the bottom of the hexagonal parabola 91 so that an enclosed reflective surface 11 is provided.

FIG. 9B illustrates a sensor 5 which may be used with the hexagonal parabola 91. In the example of FIG. 9B the sensor 5 comprises a FET with the source electrode 81 enclosing the drain electrode 83. In the example of FIG. 9B the sensor 5 has a hexagonal shape to match the shape of the reflective surface 11. Having the sensor 5 have the same shape as the reflective surface 11 may enable electromagnetic radiation 9 to be detected more efficiently.

FIG. 9C illustrates a plane view of a plurality of sensors 5 on the surface of the substrate 3. In the example of FIG. 9C six sensors 5 and reflective surfaces 11 are shown. It is to be appreciated that any number of sensors 5 and reflective surfaces 11 may be provided in other examples of the disclosure. Each of the sensors 5 has a hexagonal shape and each of the reflective surfaces 11 is a hexagonal parabola 91.

As the reflective surfaces 11 are hexagonal this enables the reflective surfaces 11 to be fitted together without leaving any gaps between adjacent reflective surfaces 11.

The use of the hexagonal parabolas 91 may provide advantages over the use of normal parabolas because the hexagonal parabolas can be fitted together more closely. In the example of FIG. 9C there are no gaps between adjacent reflective surfaces 11 which may enable all light of the desired angle that is incident on the substrate 3 to be reflected onto the sensors 5.

Figure 10:
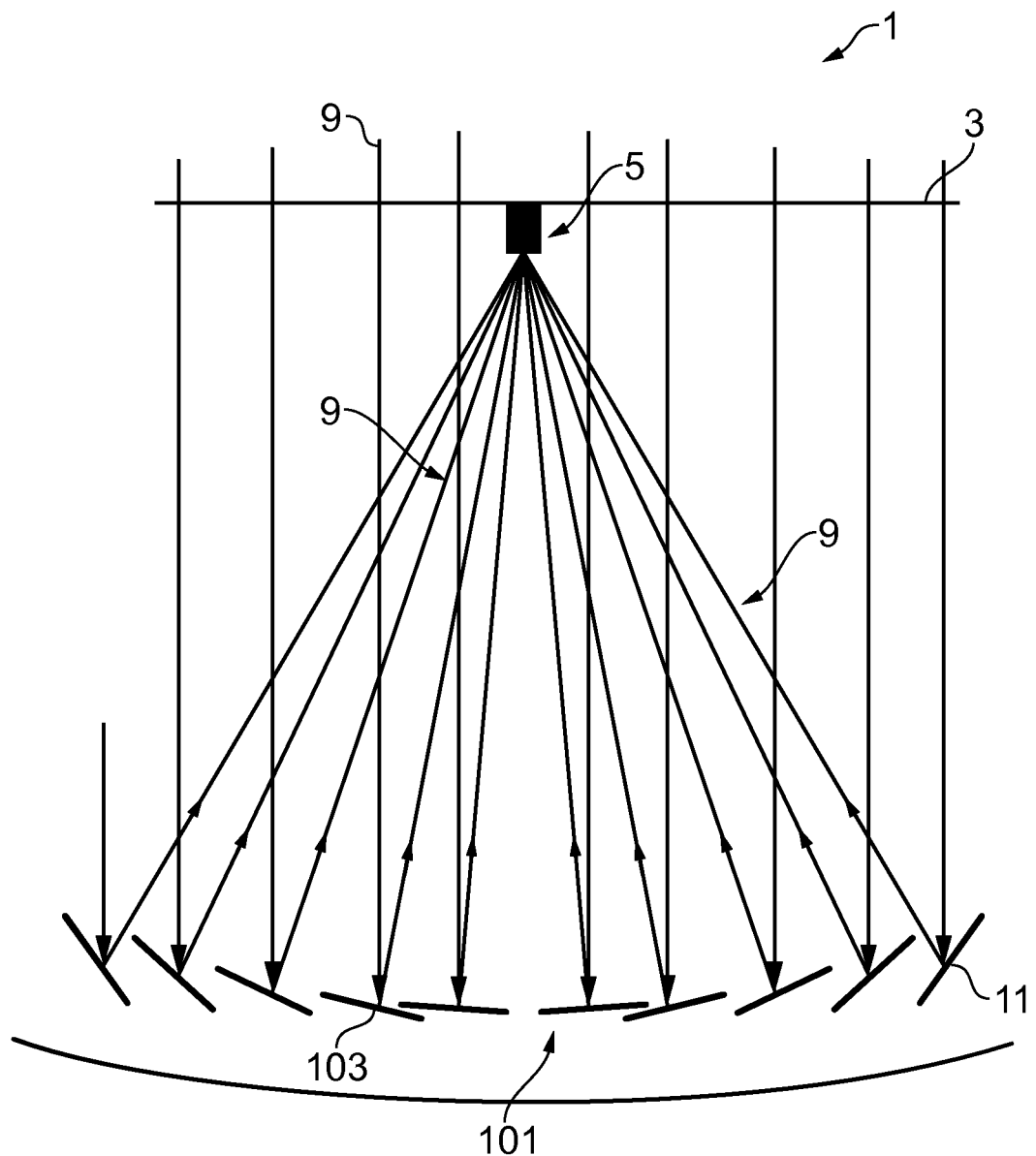
FIG. 10 illustrates an apparatus comprising a Fresnel reflective surface.

FIG. 10 illustrates another type of reflective surface 11 that may be used in some examples of the disclosure. In the example of FIG. 10 the reflective surface 11 comprises a Fresnel reflector 101. The Fresnel reflector 101 comprises plurality of linear reflectors 103. Each of the linear reflectors 103 has a flat or substantially flat surface. The linear reflectors 103 are arranged in an array so that electromagnetic radiation 9 that is incident on the Fresnel reflectors 101 is reflected towards a central point. The sensor 5 is positioned at the central point so that the sensor 5 detects the electromagnetic radiation that has been reflected by the Fresnel reflector 101.

Figure 11:
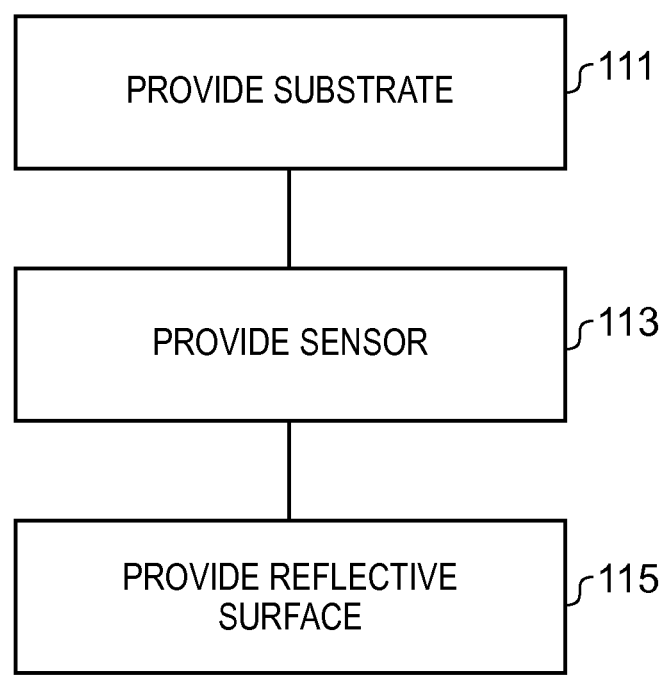
FIG. 11 illustrates an example method.

FIG. 11 illustrates an example method. The method may be used to form an apparatus 1 such as the apparatus 1 described above. The method comprises, at block 111 providing a transparent substrate 3. The method also comprises, at block 113, providing a sensor 5 arranged to detect electromagnetic radiation 9. The sensor 5 comprises two dimensional material 7 and the sensor 5 is mounted on the transparent substrate 3. The method also comprises, at block 115, providing a reflective surface 11 arranged to reflect electromagnetic radiation 9 that has passed through the transparent substrate 3 onto the sensor 5.

FIGS. 12A to 12F illustrate results obtained using an apparatus 1 according to examples of the disclosure.

In order to obtain the results shown in FIGS. 12A to 12F Comsol Multiphysics was used to model an example apparatus 1. The apparatus 1 comprises a parabolic reflective surface 11 with a diameter of 500 µm positioned beneath a sensor 5. The sensor was a GFET with dimensions of 50 µm×50 µm for the active area. The vertical distance between the sensor 5 and the reflective surface 11 was 285 µm. The sensor 5 was positioned in the center of the reflective surface 11 so that the sensor 5 was aligned with the focus of the parabola. The variation in intensity of incident electromagnetic radiation 9 upon the sensor 5 was calculated as a function of incident angle.

In FIGS. 12A and 12B the incident angle 9 for the electromagnetic radiation 9 was 0°. The electromagnetic radiation 9 was incident perpendicular to the substrate 3. FIG. 12A shows the arrangement of the apparatus 1 and FIG. 12B shows the intensity of the electromagnetic radiation 9 detected by the sensor 5. The plot of FIG. 12B shows a high intensity of electromagnetic radiation 9 detected in the centre of the sensor 5. In the examples of FIGS. 12A and 12B all of the electromagnetic radiation 9 is reflected onto an area covered by the sensor 5.

In FIGS. 12C and 12D the incident angle 9 for the electromagnetic radiation 9 was 3.5°. FIG. 12C shows the arrangement of the apparatus 1 and FIG. 12D shows the intensity of the electromagnetic radiation 9 detected by the sensor 5. The plot of FIG. 12D shows a high intensity of electromagnetic radiation 9 detected at the edge of the sensor 5. Only some of the electromagnetic radiation 9 that is reflected by the reflective surface 11 is detected by the sensor 5. Some of the electromagnetic radiation 9 is reflected to an area not covered by the sensor 5.

In FIGS. 12E and 12F the incident angle 9 for the electromagnetic radiation 9 was 6.3°. FIG. 12E shows the arrangement of the apparatus 1 and FIG. 12F shows the intensity of the electromagnetic radiation 9 detected by the sensor 5. The plot of FIG. 12F shows no electromagnetic radiation 9 detected by the sensor 5. In the example of FIGS. 12E and 12F all of the electromagnetic radiation is reflected to an area not covered by the sensor 5.

Figure 12G:
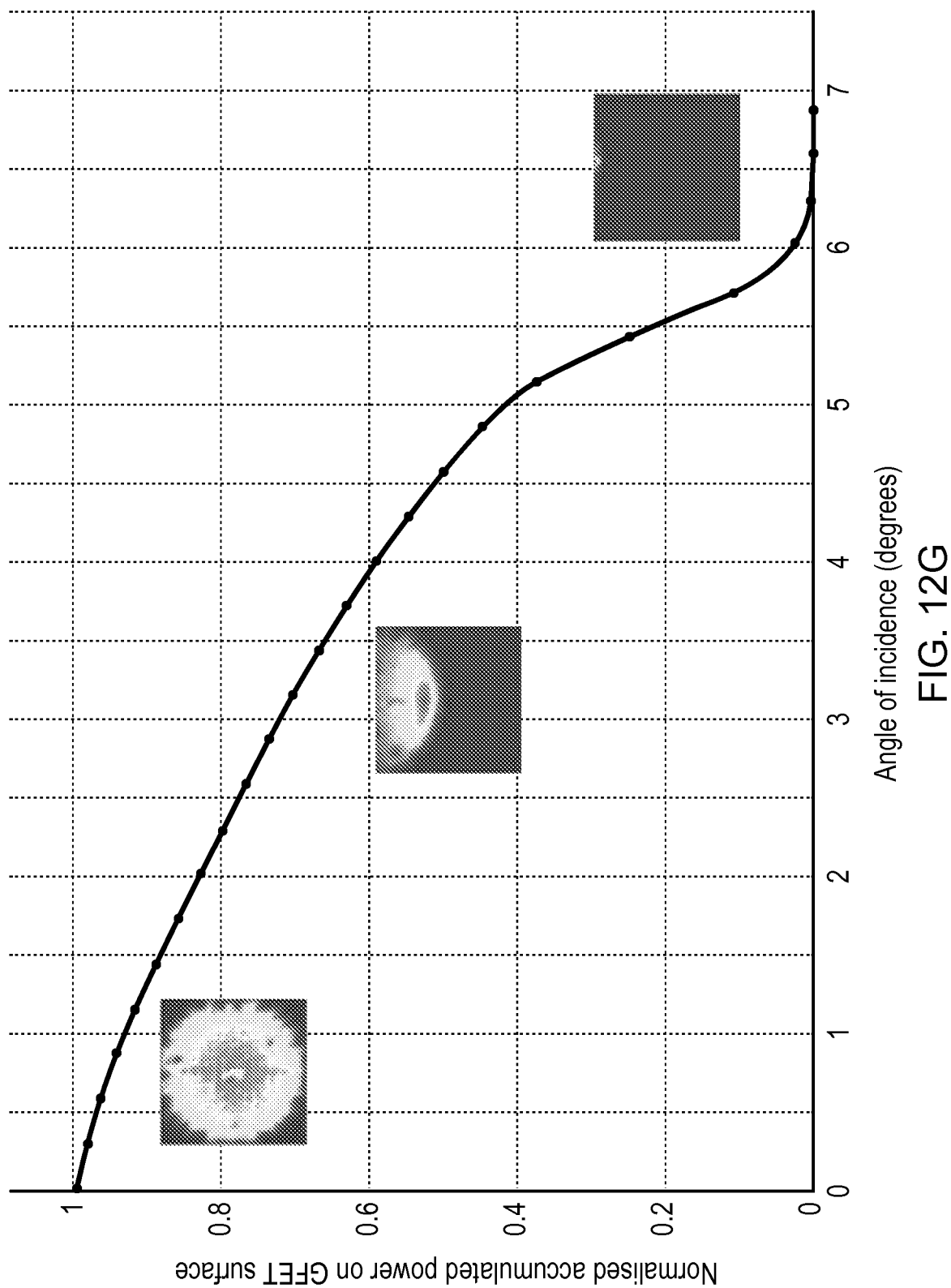
FIG. 12G illustrates a plot of power detected by a sensor against an angle of incidence of electromagnetic radiation.

FIG. 12G shows a plot of power detected by the sensor 5 against the angle of incidence of the electromagnetic radiation 9. FIG. 12G shows the power variation for angles of incidence between 0 and 7°.

The example results show that the apparatus 1 can be arranged so that only electromagnetic radiation 9 that is incident from a range of angles is detected by the sensor 5.

Examples of the disclosure as described above provide for an apparatus 1 which may be arranged to efficiently detect incident electromagnetic radiation 9. The apparatus 1 may be arranged to detect electromagnetic radiation 9 having a particular angle of incidence.

In some examples of the disclosure the apparatus 1 may be used as an imaging device. As the reflective surface 11 is arranged to reflect electromagnetic radiation 9 having a particular angular of incidence onto the sensor 5 the imaging device may be provided without any lenses. As each sensor 5 within the apparatus 1 has electromagnetic radiation 9 reflected onto it by a corresponding reflective surface 11 this means that all objects in the image may be in focus. If the sensors 5 are arranged over the surface of a sphere this may enable a virtual reality camera enabling full three dimensional imaging to be provided without the use of any conventional camera lenses. All imaged objects at any distance from the camera would remain in focus.

In some examples the apparatus 1 may be arranged so that the reflective surface 11 covers the same surface area, or almost the same surface area as the substrate 3. For instance hexagonal parabolas 91 may be used for the reflective surfaces so that the reflective surfaces 11 can be fitted together without leaving any gaps. This may provide for an efficient apparatus 1.

The sensor 5 size and the spacing between the sensors 5 may be large compared to technologies such as CMOS sensors. This may enable low cost sensors such as GFET sensors to be used. The use of sensors such as GEFTs also enables a flexible or curved apparatus 1 to be provided.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a flexible transparent substrate, said flexible transparent substrate having an upper surface and a lower surface;
   a sensor arranged to detect electromagnetic radiation, wherein the sensor comprises two-dimensional material arranged to enable an electrical output to be provided in response to incident electromagnetic radiation, and wherein the sensor is mounted on the lower surface of the flexible transparent substrate; and
   a flexible reflective surface attached to the lower surface of the flexible transparent substrate and arranged to reflect electromagnetic radiation passing through the lower surface of the flexible transparent substrate, the flexible reflective surface having a focus, and the sensor being mounted on the lower surface of the flexible transparent substrate substantially at the focus;
   wherein the flexible reflective surface is arranged to:
   focus onto the sensor electromagnetic radiation having an angle of incidence on the upper surface of the flexible transparent substrate of less than or equal to 6.3°.

2. The apparatus as claimed in claim 1, wherein the reflective surface comprises at least one of: a parabolic mirror, a Fresnel mirror, or a hexagonal parabolic mirror.

3. The apparatus as claimed in claim 1, wherein the two-dimensional material comprises graphene.

4. The apparatus as claimed in claim 1, wherein the sensor comprises at least one of: a field effect transistor or a quantum dot functionalised graphene field effect transistor.

5. The apparatus as claimed in claim 4, wherein the field effect transistor is arranged so that a first electrode is enclosed by a second electrode, the first electrode and the second electrode being separated from one another by the two-dimensional material.

6. The apparatus as claimed in claim 1, further comprising a plurality of additional sensors and a plurality of additional reflective surfaces, wherein each of the plurality of additional sensors is associated with a different one of the plurality of additional reflective surfaces, so that different reflective surfaces reflect electromagnetic radiation onto different sensors.

7. The apparatus as claimed in claim 1, wherein the sensor is arranged to detect at least one of: visible light or x-rays.

8. The apparatus as claimed in claim 1, wherein the sensor is arranged to be moved relative to the reflective surface.

9. The apparatus as claimed in claim 1, further comprising an auxiliary sensor on the upper surface of the transparent substrate.

10. The apparatus as claimed in claim 1, wherein the transparent substrate comprises a flat surface.

11. The apparatus as claimed in claim 1, wherein the transparent substrate comprises a curved surface.

12. The apparatus as claimed in claim 1, further comprising a scintillator overlying the transparent substrate.

13. A sensing device comprising an apparatus comprising:
    a flexible transparent substrate, said flexible transparent substrate having an upper surface and a lower surface;
    a sensor arranged to detect electromagnetic radiation, wherein the sensor comprises two-dimensional material arranged to enable an electrical output to be provided in response to incident electromagnetic radiation, and wherein the sensor is mounted on the lower surface of the flexible transparent substrate; and
    a flexible reflective surface attached to the lower surface of the flexible transparent substrate and arranged to reflect electromagnetic radiation passing through the lower surface of the flexible transparent substrate, the flexible reflective surface having a focus, and the sensor being mounted on the lower surface of the flexible transparent substrate substantially at the focus;
    wherein the flexible reflective surface is arranged to:
    focus onto the sensor electromagnetic radiation having an angle of incidence on the upper surface of the flexible transparent substrate of less than or equal to 6.3°.

14. A method comprising:
    providing a flexible transparent substrate, said flexible transparent substrate having an upper surface and a lower surface;
    providing a sensor arranged to detect electromagnetic radiation, wherein the sensor comprises two-dimensional material arranged to enable an electrical output to be provided in response to incident electromagnetic radiation, and wherein the sensor is mounted on the lower surface of the flexible transparent substrate; and
    providing a flexible reflective surface attached to the lower surface of the flexible transparent substrate and arranged to reflect electromagnetic radiation passing through the lower surface of the flexible transparent substrate, the flexible reflective surface having a focus, and the sensor being mounted on the lower surface of the flexible transparent substrate substantially at the focus;
    wherein the flexible reflective surface is arranged to:
    focus onto the sensor electromagnetic radiation having an angle of incidence on the upper surface of the flexible transparent substrate of less than or equal to 6.3°.

15. The method as claimed in claim 14, wherein the two-dimensional material comprises graphene.

16. The method as claimed in claim 14, wherein the sensor comprises at least one of: a field effect transistor or a quantum dot functionalised graphene field effect transistor.

* * * * *